(12) United States Patent
Goncharov et al.

(10) Patent No.: US 7,376,296 B2
(45) Date of Patent: May 20, 2008

(54) OPTICAL MULTIPLEXER

(75) Inventors: Sergey E. Goncharov, St. Petersburg (RU); Igor D. Zalevsky, Moscow (RU)

(73) Assignee: Fianium Limited, Southampton (GB)

( * ) Notice: Subject to any disclaimer, the term of this patent is extended or adjusted under 35 U.S.C. 154(b) by 0 days.

(21) Appl. No.: 10/558,519

(22) PCT Filed: May 19, 2004

(86) PCT No.: PCT/GB2004/002155

§ 371 (c)(1),
(2), (4) Date: Aug. 10, 2006

(87) PCT Pub. No.: WO2004/107017

PCT Pub. Date: Dec. 9, 2004

(65) Prior Publication Data

US 2007/0036482 A1   Feb. 15, 2007

(30) Foreign Application Priority Data

May 30, 2003   (GB) .................... 0312443.5

(51) Int. Cl.
 *G02B 6/42* (2006.01)
(52) U.S. Cl. .................. 385/18; 385/12; 385/15; 385/16; 385/17; 385/27; 372/71; 359/23
(58) Field of Classification Search ............... 385/12, 385/15–18, 27; 372/71; 359/223
See application file for complete search history.

(56) References Cited

U.S. PATENT DOCUMENTS

| 3,396,344 | A |   | 8/1968  | Broom et al. |
| 4,566,765 | A |   | 1/1986  | Miyauchi et al. |
| 4,917,453 | A |   | 4/1990  | Block et al. |
| 5,080,706 | A |   | 1/1992  | Snyder et al. |
| 5,081,639 | A |   | 1/1992  | Snyder et al. |
| 5,155,631 | A |   | 10/1992 | Snyder et al. |
| 5,268,920 | A | * | 12/1993 | Esterowitz et al. ........... 372/71 |
| 5,319,528 | A |   | 6/1994  | Raven |
| 5,463,534 | A |   | 10/1995 | Raven |
| 5,861,992 | A |   | 1/1999  | Gelbart |
| 6,044,096 | A |   | 3/2000  | Wolak et al. |
| 6,075,912 | A |   | 6/2000  | Goodman |
| 6,519,385 | B1 | * | 2/2003  | Green ....................... 385/27 |
| 6,778,716 | B1 | * | 8/2004  | Stevens et al. ............... 385/12 |
| 6,956,687 | B2 | * | 10/2005 | Moon et al. ................. 359/223 |
| 7,027,682 | B2 | * | 4/2006  | Ruan et al. .................. 385/18 |
| 7,082,232 | B2 | * | 7/2006  | Bona et al. .................. 385/17 |

OTHER PUBLICATIONS

International Search Report dated Aug. 10, 2004 in WO2004/107017 A1.

* cited by examiner

*Primary Examiner*—Frank G. Font
*Assistant Examiner*—Guy G Anderson
(74) *Attorney, Agent, or Firm*—Cook, Alex, McFaron, Manzo, Cummings & Mehler, Ltd.

(57) ABSTRACT

The invention provides an optical multiplexing device comprising: a plurality of optical sources with integrated collimators (31-37) whose output beams are combined by mirrors (41-47) or other beam deflecting elements, which combine the beams into a single composite beam diverging from a common origin point (30). This is done by arranging the mirrors (41-47) staggered at different distances from the origin point, and at different angles to each other taking account of the dependence of the beam divergence in far field on the distance from the origin point.

21 Claims, 7 Drawing Sheets

OPTICAL MULTIPLEXER

BACKGROUND OF THE INVENTION

The invention relates to a device for multiplexing laser beams into a common output beam. An important application of this kind of multiplexing is for coupling together beams from a plurality of multimode laser diodes (LDs).

FIG. 1 shows parameters of a typical multimode LD 1. The LD 1 has a stripe 2 of length 100 μm, and width 2 μm. The direction along the stripe is often called the slow axis and the direction across the stripe the fast axis. In the figure, the fast axis coincides with the Y-axis and the slow axis coincides with the X-axis. The output beam from the LD 1 is characterised by waist sizes $W_x$ and $W_y$. The output beam diverges from the near field to the far field. The divergence is highly asymmetric, resulting in a correspondingly asymmetric spatial distribution of optical radiation in the far field, illustrated schematically in the figure by the far-field beam cross-section 3. The divergence across the fast axis is characterised by an angle $\beta_x \sim 40°$ and is almost diffraction limited. The divergence in the Y-direction is characterised by an angle $\beta_y \sim 10°\text{-}14°$. To characterise spatial distribution of an optical beam it is convenient to introduce the following parameter:

$$M^2 = \pi(W/2)\sin(\beta/2)/\lambda \qquad (1)$$

which defines the degree of dissimilarity of a beam under consideration from a diffraction-limited beam. From Eq. (1) one can find that for typical laser diode $M^2_x=18$ and $M^2_y=1.2$. In other words, output radiation from a laser diode is almost diffraction limited in the Y-direction (along the fast axis) and 18 times "worse" than diffraction limited beam in the X-direction.

The fact that output beam from LDs is essentially diffraction-limited in one direction and non-diffraction limited in the orthogonal direction allows for efficient spatial multiplexing when a number of beams are stacked in such a way that $M^2$ is approximately equal in both directions. For example, if one stacks 15 beams along the Y-axis then such a source will have $M^2_x \sim M^2_y=18$ (since 15×1.2=18). In applications where a single mode beam is not required, for example coupling light into a circular multimode fibre, the coupling efficiency is determined by $M^2_{max}$ so that the coupling efficiency from a single stripe LD with $M^2_x=18$ and $M^2_y=1.2$ is approximately the same as from a LD stack with $M^2_x=M^2_y=18$, but the coupled optical power will be 10 times greater in the latter case.

This multiplexing or coupling principle was first used in 1968, as described in U.S. Pat. No. 3,396,344 [1] in which beam combining is achieved by collimating the fast axis and focusing by a cylindrical lens. More recent multiplexing designs are disclosed in U.S. Pat No. 5,319,528 [2] and U.S. Pat. No. 6,075,912 [3].

SUMMARY OF THE INVENTION

The invention provides an optical multiplexing device comprising: a plurality of n optical sources that output respective beams with asymmetric spatial distributions; a plurality of n collimators arranged adjacent to respective ones of the optical sources so as to collimate their output beams; and at least n-1 beam deflectors, each associated with one of the optical sources, and arranged so as to deflect the respective beams so that after deflection the beams are combined to form a single composite beam diverging from a common origin point.

In embodiments of the invention, the at least n-1 beam deflectors are positioned at distance z from the origin point that are in far-field, far-field being defined as $z > \pi \omega_0^2/\lambda$, where $2\omega_0$ is the beam waist diameter and $\lambda$ is the operating wavelength. Moreover, the at least n-1 beam deflectors are preferably arranged at an angle that takes account of the z dependence of the angle of beam divergence. In some embodiments of the invention there is only one beam deflector. In other embodiments of the invention there are a plurality of beam deflectors, and the beam deflectors are arranged staggered at different distances z from the origin point, and at different angles to each other taking account of the z dependence of the angle of beam divergence (in far field). The collimated output beams will generally be at an angle to each other prior to deflection.

With the invention it is possible to arrange the at least n-1 beam deflectors such that the deflected beams do not overlap and do not block deflected beams from other ones of the beam deflectors, thereby avoiding loss of power during the beam combining.

In principle, the collimators could be complex multi-component arrangements, but hey are preferably single optical elements, for example a single microlens. The collimators can be conveniently fixed by cementing to their respective optical sources.

The collimators are preferably arranged to achieve minimum beam divergence in far field. This can be done during assembly by imaging onto a sheet of paper or other imaging plane. The collimators are also preferably arranged so that their beam waists are formed either on output facets of the optical sources, or within the optical sources.

The asymmetric spatial distributions of the output beams can be characterised by a fast axis and a slow axis, and the collimators are preferably arranged to collimate the output beams along their fast axes.

The optical sources can be lasers or non-laser sources. In the main embodiments described below, the optical sources are multimode diode lasers.

The beam deflectors are mirrors in the main embodiments described below, but prisms could also be used, or any other suitable optical elements.

Embodiments of the invention are expected to be most usually used to combine perhaps 3 to 8 beams together, but any number of beams in the range 2-10 would not be unusual. In principle higher numbers of beams could also be combined, for example up to 20 or 30 beams.

The device may further comprise a focusing element, such as a lens or mirror, arranged to focus the combined beam to a coupling region for coupling into an entrance aperture of an external component such as an optical fibre or other type of waveguide, e.g. a planar waveguide.

The packaged device could be used as a pump module for pumping a fibre laser or fibre amplifier for example.

These and other features, advantages and aspects of the invention are listed as follows:

1. Spatial beam combination is performed such that all the beams are combined to have a common spatial image in space, or the waists of all the beams after combination converge in space.
2. Spatial beam combining when each optical beam occupied such predetermined by parameters α and $Z_0$ position that there is no spatial overlapping of the combined beams.
3. Collimator is preferably arranged in such a way that the beam waists on fast and slow axes are overlapped.
4. The combined beams are preferably Gaussian beams.

5. For Gaussian beams, the parameters $\alpha$ and $Z_0$ are preferably substantially governed by the expression $Z_0 \tg(\alpha/2) \gtrsim \omega_0 (1+(z_0 \lambda/(\pi\omega_0^2))^2)^{1/2}$
6. The parameters $\alpha$ and $Z_0$ are preferably substantially governed by the expression $\alpha/2 \gtrsim \phi_0 = f(z_0$ where $f(z)$ determined by the spatial boundary of the multiplexed optical beam.
7. The collimated beams prior to deflection are not parallel and the divergence of optical axis of the collimated beams is chosen to achieve highest brightness of the device.
8. The collimated beams prior to deflection do not lie in the same plane.

BRIEF DESCRIPTION OF THE DRAWINGS

For a better understanding of the invention and to show how the same may be carried into effect reference is now made by way of example to the accompanying drawings.

DETAILED DESCRIPTION

An embodiment of the invention relating to multiplexing two or more non-symmetrical laser beams from laser diodes is now described, where the beams are multiplexed in the direction of the fast axes of the beams. There are two key features of the multiplexing, namely:
1. collimation of the laser beams
2. deflection of the collimated beams (with possible exception of the first one which need not be deflected).

Each of these features is now described in turn.

1. Collimation

In the collimation stage, one collimates each laser beam in the direction of the fast axis only in such a way that the waist sizes $W_x$ and $W_y$ are approximately equal to each other and both waists are located at approximately the same position along the z-axis.

Figure 1:
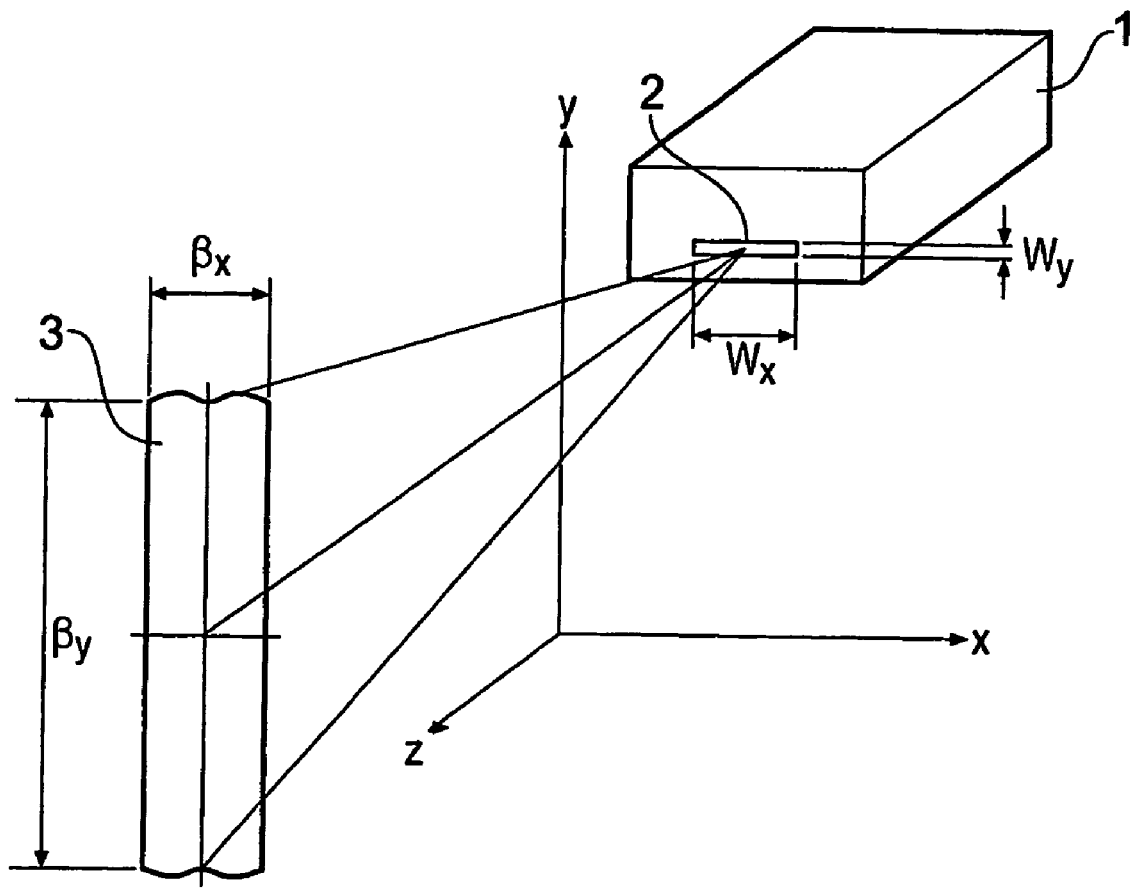
FIG. 1 shows general characteristics of a standard laser diode.
Figure 2:
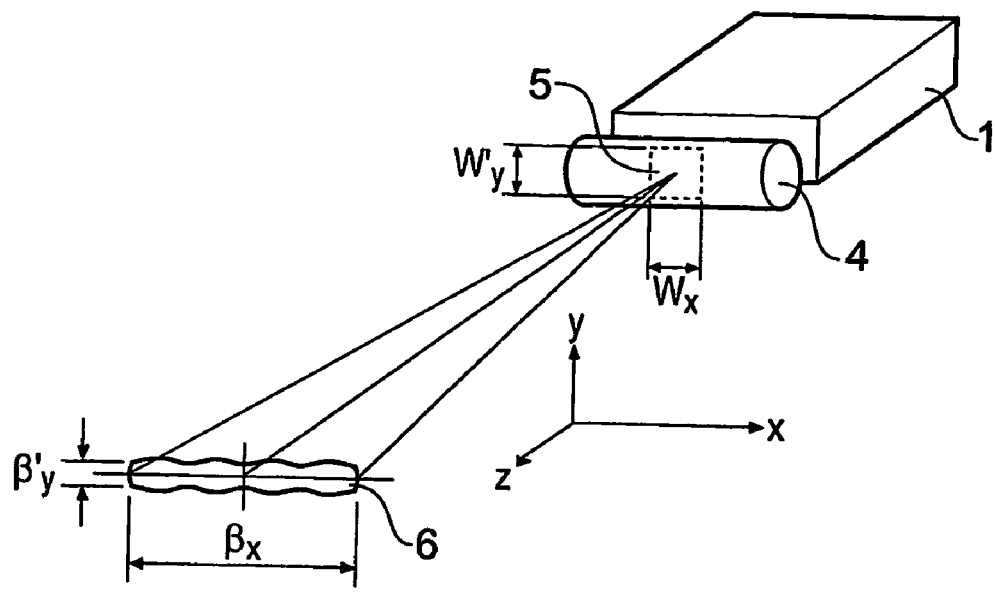
FIG. 2 is a schematic perspective view of a laser diode and collimator combination which forms a component of a device embodying the invention.
Figure 3:
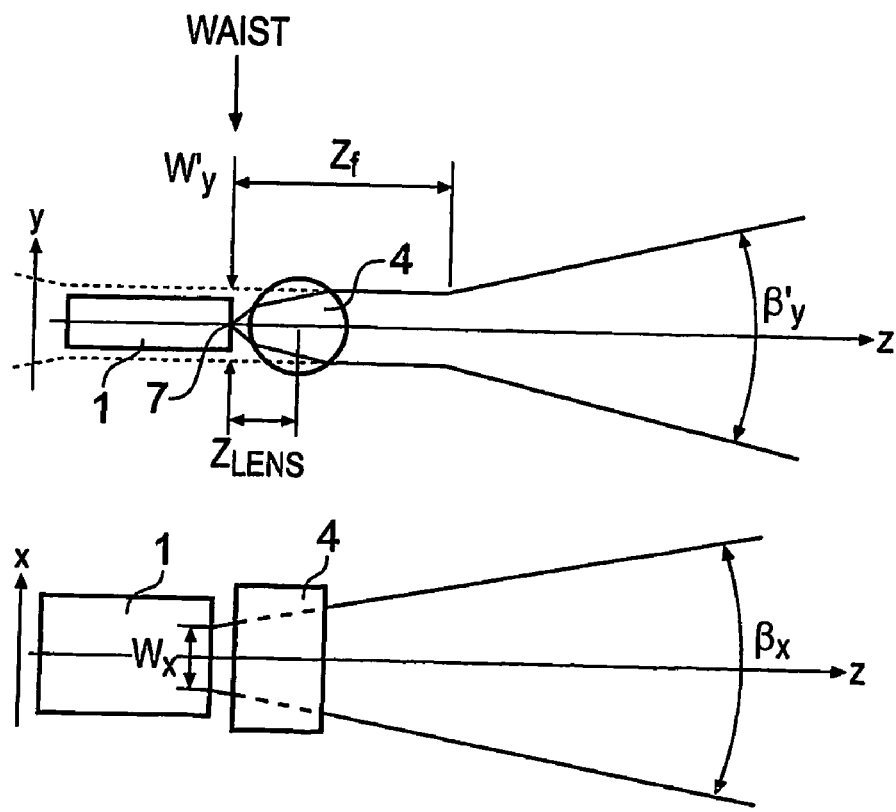
FIG. 3 shows plan and side views of the component of FIG. 2.

FIGS. 2 and 3 show views of a laser diode and collimator combination that achieves this result. FIG. 2 is a perspective view, FIG. 3 (upper) is a side view and FIG. 3 (lower) is a plan view. The figures show a collimator in the form of a cylindrical lens 4 arranged adjacent to the output facet of a LD 1, wherein the cylindrical lens 4 has its optical axis extending in the X-direction, i.e. aligned with the slow axis, so that the output beam is collimated along the fast axis (Y-direction).

The cylindrical lens 4 is arranged such that the waist sizes $W_x$ and $W_y$ are approximately equal, i.e. square in cross-section (shown in FIG. 2 by the dotted lines 5), where the waist $W_y$ is the imaginary waist of the output beam after collimation and the waist $W_x$ is the natural waist at the laser diode output.

A laser with such a collimated beam can be considered as a new light source with approximately symmetrical near field, as illustrated in FIG. 2 by the sketched square cross-section 5 and highly asymmetrical far field, as illustrated in FIG. 2 by the sketched cross-section 6. It is noted that, since the slow axis waist coincides with output facet of the laser diode (see FIG. 3—lower), the fast axis waist should be positioned at the laser diode output facet as well (see FIG. 3—upper).

Figure 4:
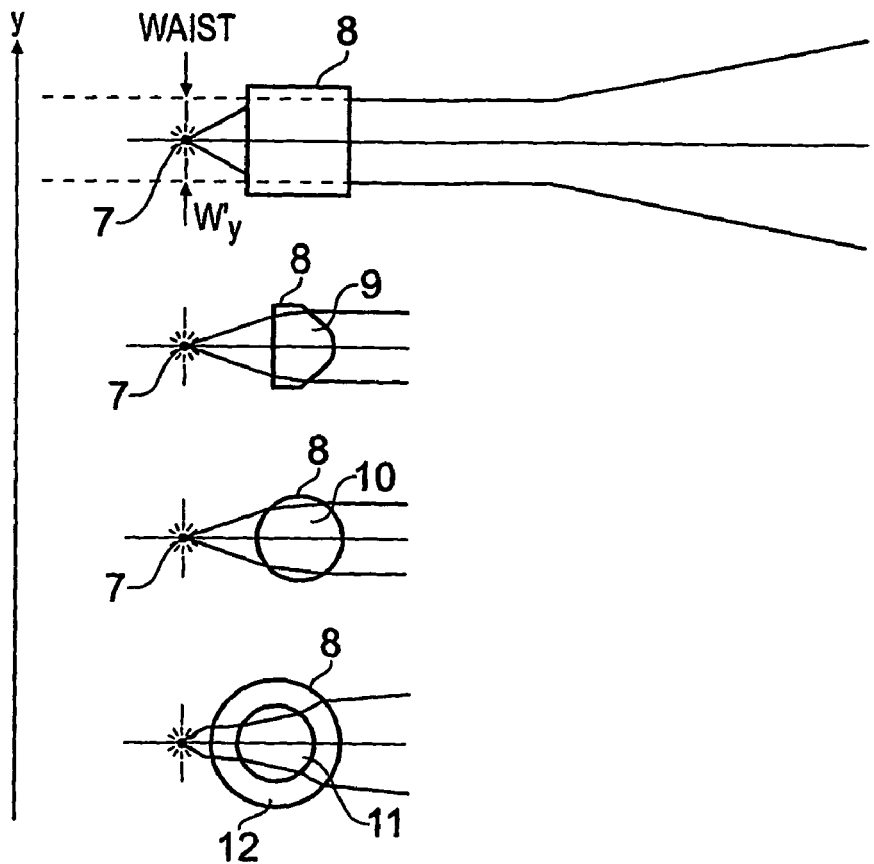
FIG. 4 shows various alternative designs of collimator suitable for use in a device embodying the invention.

FIG. 4 shows various different embodiments of the collimator 8 by way of example. The focal point 7 at the beam waist is also shown. Other collimator designs could also be used. In the upper drawing, the collimator is shown as a "black box", i.e. a multicomponent lens and/or mirror arrangement. In the next drawing, an aspherical cylindrical lens 9 is the collimator element. In the next drawing, a cylindrical lens 10 with gradient refractive index profile is used. Finally, in the lowest drawing, a cylindrical lens comprising two materials with different refractive indices 11, 12 is used to provide a step refractive index profile.

Figure 5:
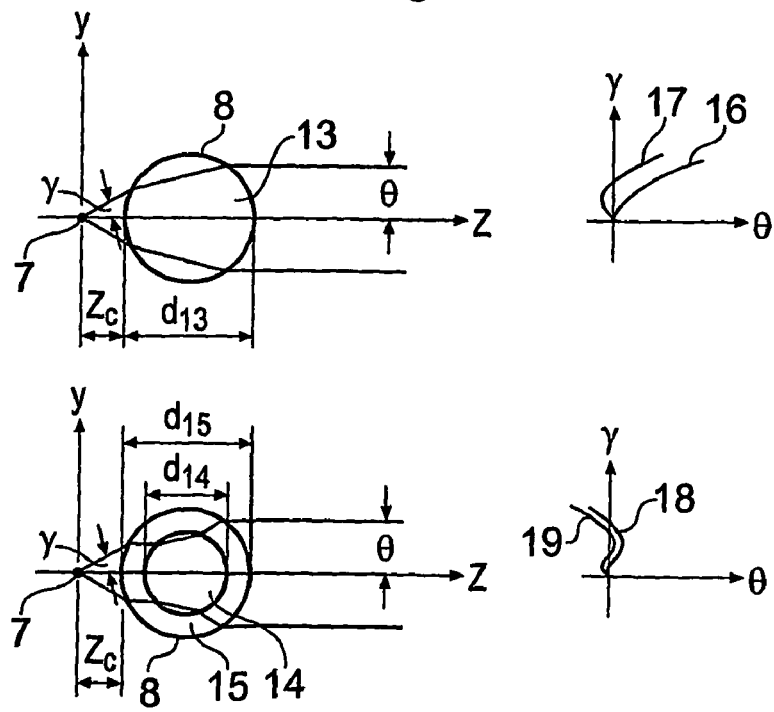
FIG. 5 shows aspects of collimator design shown at the bottom of FIG. 4 in more detail.

FIG. 5 shows the advantages of using a step index profile. The use of a complex cylindrical lens 14, 15 allows for compensation of geometrical aberrations. By suitable choice of the outer diameters $d_{14}$ and $d_{15}$ of the cylinders 14 and 15, and their refractive indices, one can achieve substantial compensation of geometrical aberrations.

If a simple cylindrical lens 13 of outer diameter $d_{13}$ is used as shown on the upper left drawing in FIG. 5, then the larger the divergence of the incident beam the greater the geometrical aberrations as shown on the upper right drawing in FIG. 5. Those geometrical aberrations result in a decrease in brightness of the optical system. The use of complex lens comprising two cylinders 14, 15 with different refractive indices such that the inner cylinder 14 has a lower refractive index than the outer cylinder 15 results in a significant reduction of geometrical aberrations as shown in lower right drawing in FIG. 5, which in turn will result in an increase in brightness of the optical system.

It is an important advantage of the design that only one component is needed for optical beam collimation, i.e. from a practical point of view the collimator design is relatively simple and straightforward. For assembly, the collimator lens can be cemented to the laser diode in a conventional manner.

The optical beam after collimation could be Gaussian, near-Gaussian or arbitrary.

Figure 6:
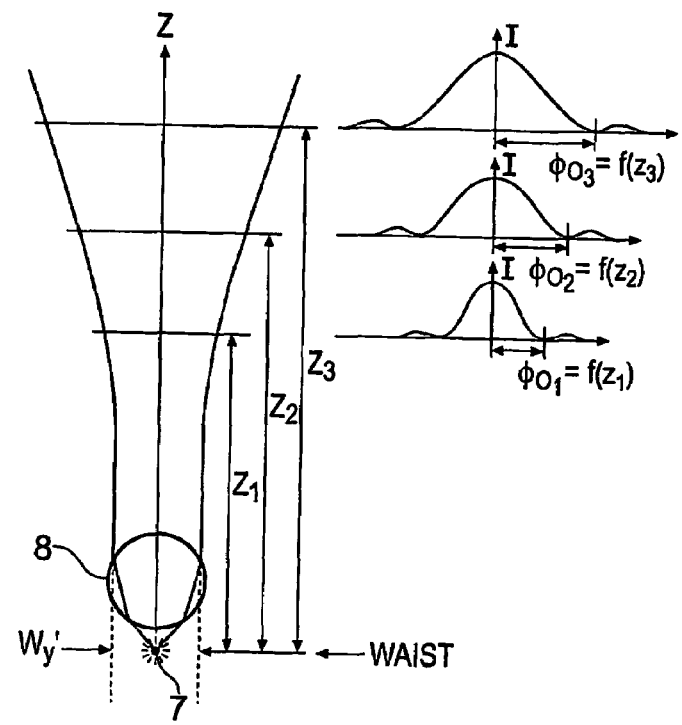
FIG. 6 shows intensity distributions at different far field positions along the optical axis of a single beam collimated according to the invention.

FIG. 6 shows intensity distributions along the optical axis z of the collimated beam at different distances away from the origin point. A beam of origin 7 is collimated by a cylindrical lens 8 to form a fast axis waist of dimension $W_y$. Along the propagation direction z, the beam continues to diverge in the Y-axis in far field. The figure shows inset the intensity distributions plotted as intensity I against the Y-axis at three different distances from the origin, namely $z_1$, $z_2$ and $z_3$, all of which lie in far field. As illustrated, the collimated optical beam has a near field with low divergence and a far field with constant divergence. If one considers intensity distribution in the Y-direction then as is evident from the inset intensity distributions, at certain positions light intensity is equal to zero. Those points can be characterised by an angle $\phi_0$ in respect of the z-axis, and it is evident from FIG. 6 that $\phi_0 = \phi_0(z)$.

2. Deflection

Figure 7:
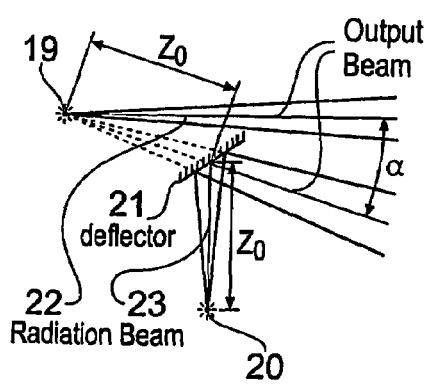
FIG. 7 is a geometric ray trace diagram of a combination of two point sources, one with deflector, one without.
Figure 8:
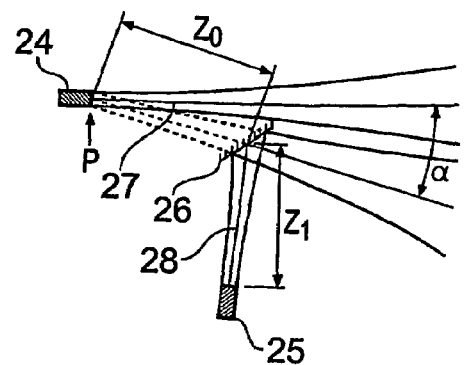
FIG. 8 is of the same general optical set-up as FIG. 7, but shows laser diode sources with finite beam waists instead of point sources.

Deflection should Satisfy Two Conditions:

1. A deflector (21, 26, 41-47) should deflect its incident beam in such a way that all images of all deflected beams coincide in space (FIG. 7). In other words, the (imaginary) waists of all beams should overlap in space (FIG. 8).
2. The beams themselves should not overlap, i.e. each optical beam should occupy its own specific space, otherwise some of the deflectors will block part of the optical beam from other laser diodes. FIGS. 7 and 8 illustrate this principle for two sources, one direct and the other deflected. FIG. 7 deals with point sources 19, 20. Deflector 21 is situated in far field and at equal distance $z_0$ from both sources 19 and 20. FIG. 8 shows application of this principle in a case of laser diodes 24 and 25. It is important that the image of either point source 20 or laser diode 25 overlaps with the position of the other light source (point source 19 in FIG. 7 or laser diode source 24 in FIG. 8). To avoid possible confusion, it is noted that in both examples, one of the images is a virtual image so there is no overlap of the beams themselves.

Condition 2 can be met by proper choice of parameters $\alpha$ and $z_0$. For example, for Gaussian beams, $\alpha$ and $z_0$ should satisfy the following condition $$z_0 tg(\alpha/2) \geq \omega_0 (1 + (z_0 \lambda/(\pi \omega_0^2))^2)^{1/2} \quad (2)$$

where $2\omega_0$ is the beam waist diameter and $\lambda$ is the operating wavelength. From this expression it is clear that the greater $z_0$ the smaller the $\alpha$ and this means that the for high density "beam packaging" one should position the deflectors as far as possible away from the (imaginary/virtual) source position 7.

In the case of an arbitrary (non-Gaussian) beam, as shown in FIG. 6, the condition (2) can be re-written as follows:

$$\alpha/2 \geq \phi_0 = f(z_0) \quad (3)$$

where function $\phi_0 = f(z)$ defines the beam area which has to be multiplexed (for example the area limited by the first zero intensity minima in FIG. 6).

Figure 9:
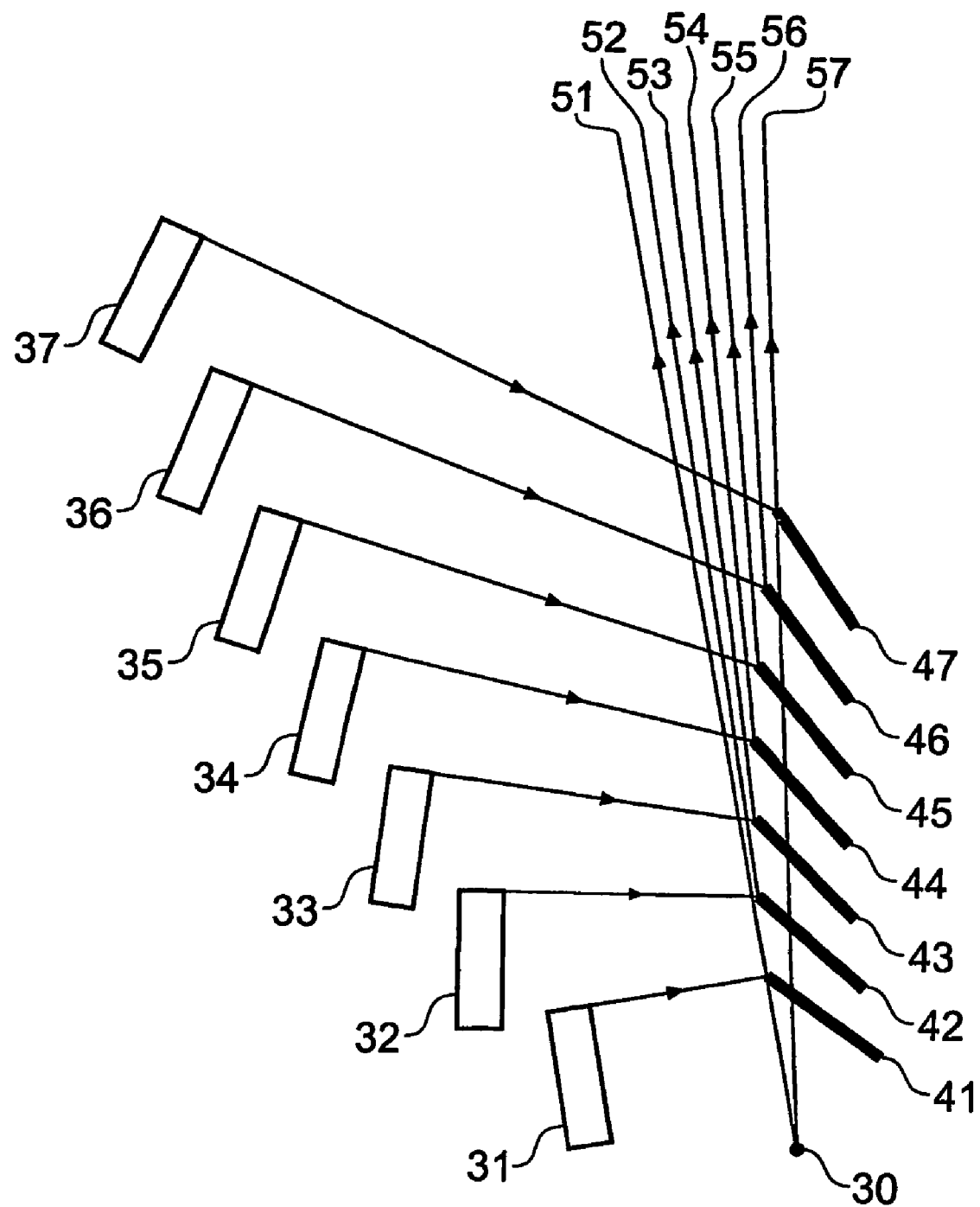
FIG. 9 shows an example commercial device embodying the invention in which seven laser beams from seven laser diodes are multiplexed into a single combined output beam by respective deflecting mirrors.

FIG. 9 shows a commercial device where 31-37 are laser diodes with their own collimators, 41-47 are deflectors situated in the far field region of the laser diode beams, and 51-57 are deflected beams (for simplicity only the principal axes of the beams are shown). Reference numeral 30 indicates the common imaginary source position of the multiplexed beams. An additional laser diode, with collimator, can be placed at point 30 if desired (as in FIG. 8 example). Such a laser diode would of course not require a deflector.

It is important to note that the angles between adjacent beams are different and have been chosen in accordance with Eq. 3. If $\alpha < \alpha_{opt}$ then it will result in loss of multiplexed output power because one or more deflectors would block optical power from adjacent beams. On the other hand, if $\alpha > \alpha_{opt}$ then loss of optical brightness of the multiplexed beam will follow.

Figure 10:
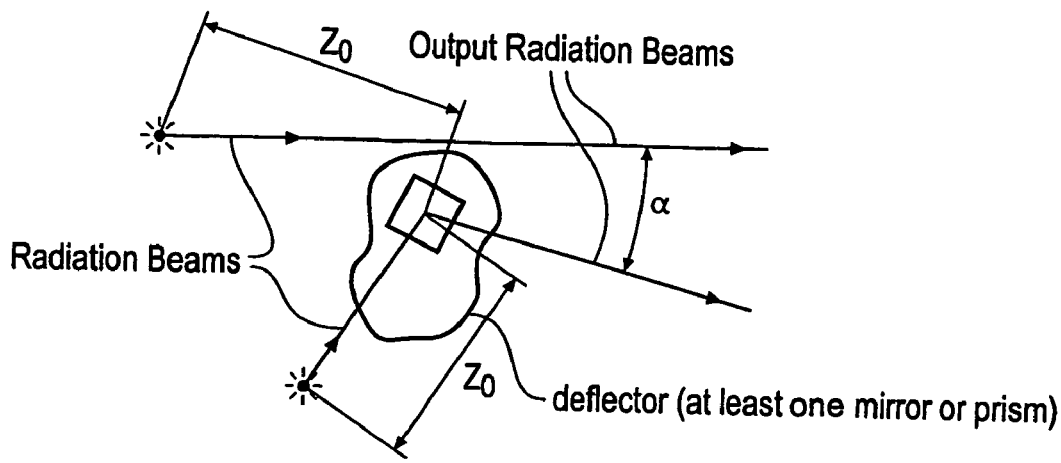
FIG. 10 illustrates design principles of the beam combination taught by the invention.

FIG. 10 illustrates the beam combination principle of the invention. A key feature here is that the multiplexed beams are not parallel and diverge from one common (imaginary) point. This contrasts from all the prior art solutions referred to above in which the multiplexed beams are all parallel to each other. Another important distinction from the prior art solutions, is that in the proposed solution the multiplexing occurs in far field, i.e. when $Z > \pi \omega_0^2 / \lambda$, whereas in all the prior art solutions multiplexing has been done in the near field.

Figure 11:
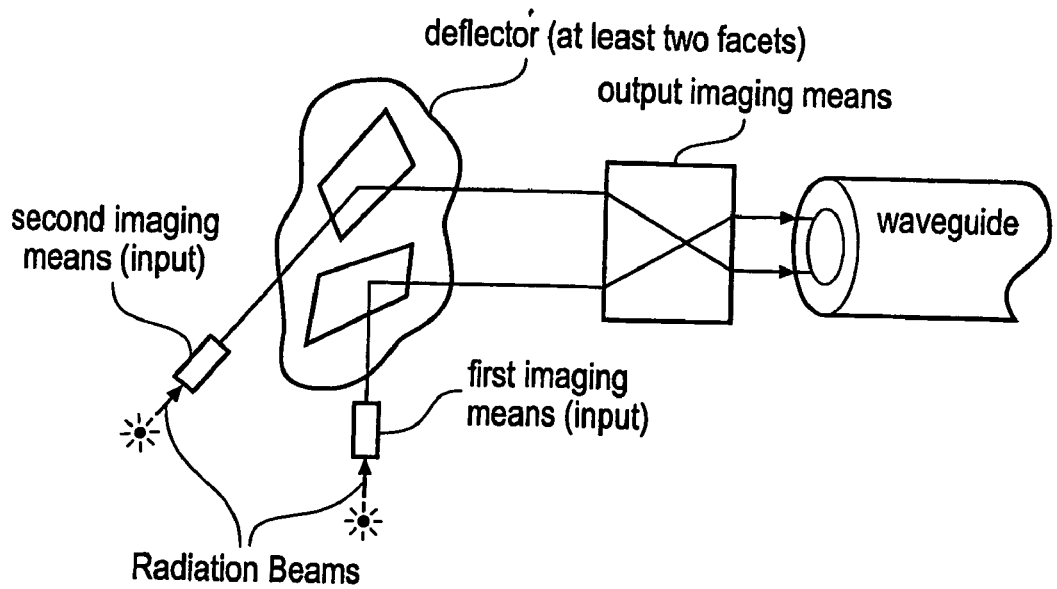
FIG. 11 is a schematic illustration of the design of U.S. Pat. No. 6,075,912 [3] for comparison with FIG. 10.

FIG. 11, showing a prior art scheme, emphasises fundamental differences between the prior art and the invention, since in the prior art design all the deflected elements are situated in near field and all the multiplexed beams are parallel. This prior art does not allow one to achieve highest brightness and efficiency of the multiplexer. According to the teaching of the present invention it will thus be understood that, in order to achieve highest brightness of the multiplexed beam, the angles of the collimated beams need to be different and the collimated beams should not be parallel. Moreover, the deflected beams should not parallel and do not even need to lie in the same plane.

3. Applications Example

Figure 12:
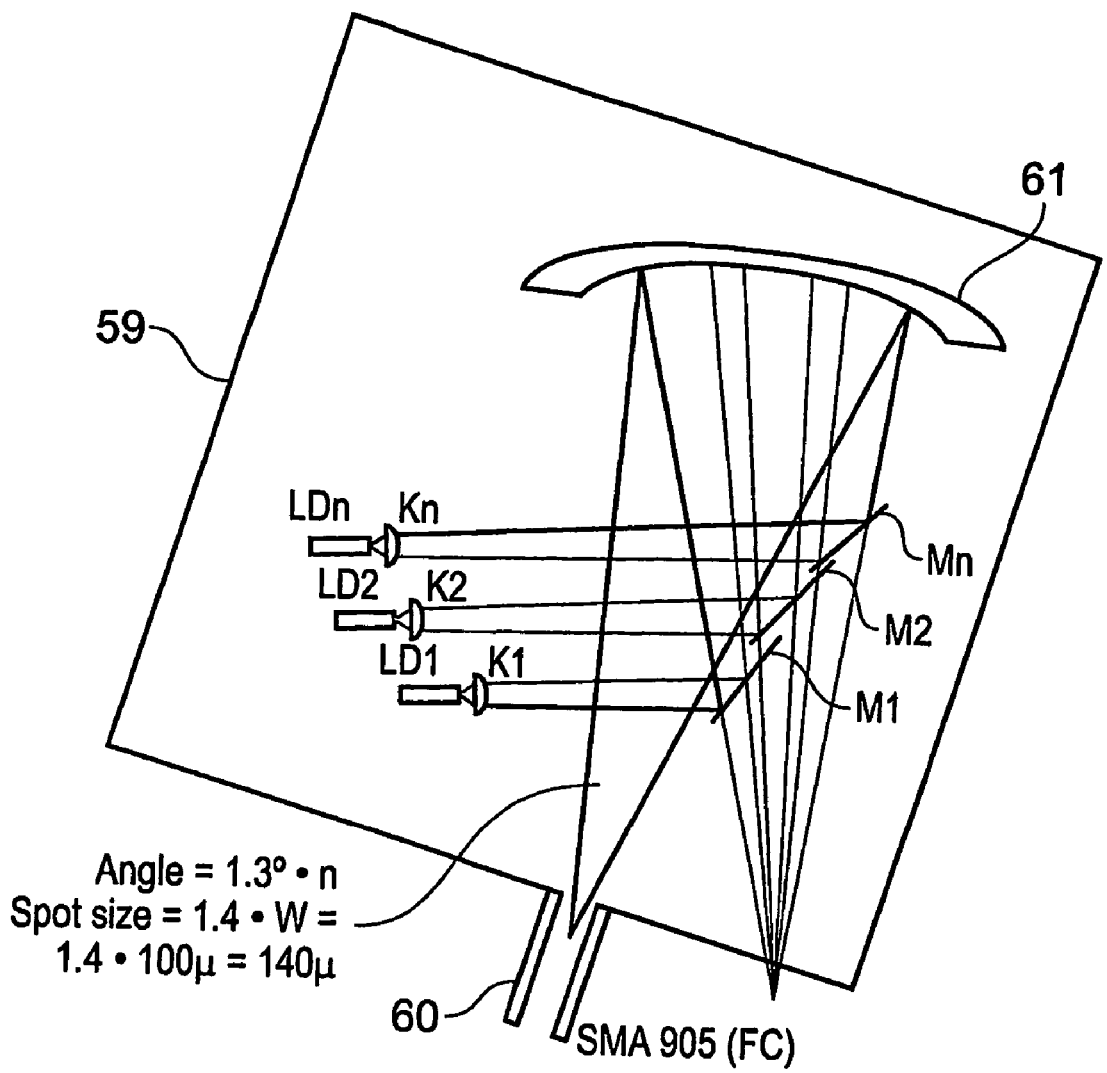
FIG. 12 shows a pump module according to an embodiment of the invention.

FIG. 12 shows a pump module contained in a housing 59 which incorporates a multiplexer as described above for launching power from a plurality of laser diodes $LD_n$ into an optical fibre 60. The laser diode outputs are collimated by collimating lenses $K_n$ into collimated beams that are incident on respective deflecting mirrors $M_n$ which combine the n beams to form a single composite beam diverging from a common origin point (see converging dashed lines) as will be understood from the foregoing description. Typically, n would be in the range 2-8. The composite beam is then incident onto a focusing element in the form of a concave mirror 61 located in far field in respect of the common origin point. The concave mirror 61 is arranged to focus the combined beam generated by the deflecting mirrors $M_n$ to a coupling region close to the housing wall for coupling the light into a component external to the module. In this example the external component is an optical fibre 60 whose end face forms an entrance aperture for the focused beam. The optical fibre 60 can be fixed to the module in a convenient manner by providing a ferrule (not shown) integral with the housing 59.

4. Variations

The embodiments described above concentrate on using mirrors as the deflectors. As an alternative, prisms could be used as deflectors.

The embodiments use LDs as the laser sources. Other types of laser sources could be used, for example solid state lasers, e.g. YAG, or gas lasers, e.g. $CO_2$ slabs. The invention could also be applied to combining other kinds of (non-laser) optical beams with asymmetric divergence properties, e.g. conventional or superfluorescent LEDs.

Moreover, the optical sources could be waveguides, such as planar waveguides or optical fibres. In the case of optical fibres these could be single mode or multimode. The waveguides could be active or passive, i.e. they could be used passively for relaying an optical signal generated from a remote light source or they could be active devices with intrinsic gain, such as may be caused by doping with rare earth elements.

REFERENCES

[1] U.S. Pat. No. 3,396,344
[2] U.S. Pat. No. 5,319,528
[3] U.S. Pat. No. 6,075,912

The invention claimed is:

1. A multiplexed optical source device comprising:
   a plurality of n optical sources that output respective beams with asymmetric spatial distributions;
   a plurality of n collimators arranged adjacent to respective ones of the optical sources so as to collimate their output beams; and
   at least n-1 beam deflectors, each associated with one of the optical sources, and arranged so as to deflect the respective beams so that after deflection the deflected beams do not overlap and do not block deflected beams from other ones of the beam deflectors, and so that the beams are spatially multiplexed in the far field to form a single composite beam diverging from an imaginary common origin point thereby avoiding loss of power and spectral brightness during the beam combining.

2. The device of claim 1, wherein the at least n-1 beam deflectors are positioned at distance z from the origin point that are in farfield, far-field being defined as $z > n\,\omega^2_0/\lambda$, where $2\omega_0$ is the beam waist diameter and $\lambda$ is the operating wavelength.

3. The device of claim 2, wherein the at least n-1 beam deflectors are arranged at an angle that takes account of the z dependence of the angle of beam divergence.

4. The device of claim 2, wherein there are a plurality of beam deflectors, and the beam deflectors are arranged staggered at different distances z from the origin point, and at different angles to each other taking account of the z dependence of the angle of beam divergence.

5. The device of claim 1, wherein the collimated output beams are at an angle to each other prior to deflection.

6. The device of claim 1, wherein the collimators are single optical elements.

7. The device of claim 1, wherein the collimators are cemented to their respective optical sources.

8. The device of claim 1, wherein the collimators are arranged to achieve minimum beam divergence in far field.

9. The device of claim 1, wherein the collimators are arranged so that their beam waists are formed on output facets of the optical sources, or within the optical sources.

10. The device of claim 1, wherein the output beams have a fast axis and a slow axis, and the collimators are arranged to collimate the output beams along their fast axes.

11. The device of claim 1, wherein the optical sources are lasers.

12. The device of claim 11, wherein the lasers are diode lasers.

13. The device of claim 1, wherein the beam deflectors are mirrors.

14. The device of claim 1, wherein the beam deflectors are prisms.

15. The device of claim 1, wherein n is in the range 2-10.

16. The device of claim 1, wherein n is in the range 3-8.

17. The device of claim 1, further comprising a focusing element arranged to focus the combined beam to a coupling region for coupling into an external component.

18. The device of claim 1, further comprising a waveguide having an entrance aperture positioned to receive the combined beam.

19. The device of claim 18, wherein the entrance aperture is arranged at the coupling region.

20. The device of claim 18, wherein the waveguide is an optical fibre.

21. The device of claim 18, wherein the waveguide is a planar waveguide.

* * * * *

UNITED STATES PATENT AND TRADEMARK OFFICE
CERTIFICATE OF CORRECTION

PATENT NO. : 7,376,296 B2
APPLICATION NO. : 10/558519
DATED : May 20, 2008
INVENTOR(S) : Goncharov et al.

It is certified that error appears in the above-identified patent and that said Letters Patent is hereby corrected as shown below:

On the title page, Item (57) under "ABSTRACT", line 9, "accourt" should read --account--.
Col. 1, line 40, the numeral "15" should not be bolded.
Col. 2, line 22, "hey" should read --they--.
Col. 3, line 5, "f($z_o$ where f(z)" should read --f($z_o$) where f($z_o$) is--, line 9, insert --the-- before "optical axis", line 26, insert --a-- before "collimator", line 28, insert --the-- before "collimator design".
Col. 4, line 32, insert --a-- before "gradient refractive index profile", line 47, insert --a-- before "complex lens", line 51, insert --the-- before "lower right drawing".
Col. 5, line 43, "the smaller the a" should read --the smaller the $\alpha$--, and delete "the" before "for high density", line 50, in equation (3), "$\phi_0=f(z_o)$" should read --$\phi_o=f(z_o)$--, line 62, insert --the-- before "FIG. 8".
Col. 6, line 14, "emphasises" should read --emphasizes--, line 24, insert --be-- before "parallel".
Col. 7, line 24, "farfield" should read --far-field--, and "z>n" should read --z>$\pi$--.

Signed and Sealed this

Third Day of February, 2009

JOHN DOLL
*Acting Director of the United States Patent and Trademark Office*